(12) United States Patent
Xing et al.

(10) Patent No.: US 11,624,782 B2
(45) Date of Patent: Apr. 11, 2023

(54) CORE PARTITION CIRCUIT AND TESTING DEVICE

(71) Applicant: Shanghai Zhaoxin Semiconductor Co., Ltd., Shanghai (CN)

(72) Inventors: Yunhao Xing, Beijing (CN); Huafeng Xiao, Beijing (CN); Peng Wang, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 172 days.

(21) Appl. No.: 17/085,019

(22) Filed: Oct. 30, 2020

(65) Prior Publication Data

US 2022/0099735 A1 Mar. 31, 2022

(30) Foreign Application Priority Data

Sep. 29, 2020 (CN) .......................... 202011046827.8

(51) Int. Cl.
*G01R 31/3177* (2006.01)
*G01R 31/317* (2006.01)
(Continued)

(52) U.S. Cl.
CPC ..... *G01R 31/3177* (2013.01); *G01R 31/2851* (2013.01); *G01R 31/31704* (2013.01);
(Continued)

(58) Field of Classification Search
None
See application file for complete search history.

(56) References Cited

U.S. PATENT DOCUMENTS 7,702,983 B2 * 4/2010 Casarsa .......... G01R 31/318547
714/729
7,814,444 B2 * 10/2010 Wohl .................... G06F 30/327
716/111
(Continued)

FOREIGN PATENT DOCUMENTS

CN 103250065 A 8/2013
CN 103913702 A 7/2014
(Continued)

OTHER PUBLICATIONS

Lee et al., On-Chip Self-Test Methodology With All Deterministic Compressed Test Patterns Recorded in Scan Chains, Feb. 2019, IEEE, vol. 38, No. 2, pp. 309-321. (Year: 2019).*
(Continued)

*Primary Examiner* — John J Tabone, Jr.
(74) *Attorney, Agent, or Firm* — McClure, Qualey & Rodack, LLP (57) ABSTRACT

A core partition circuit comprises a first decompression circuit, a second decompression circuit, a first switching circuit, an wrapper scanning circuit, a first compression circuit, a second compression circuit and a second switching circuit. The first and second decompression circuits decompress an input signal. The first switching circuit outputs the output signal of the first decompression circuit or the second decompression circuit according to a first control signal. The wrapper scanning circuit receives the output signal of the first decompression circuit or the second decompression circuit to scan the internal or the port of the core partition circuit. The first and second compression circuits respectively compress the internal logic and the port logic of the core partition circuit. The second switching circuit outputs the compressed internal logic or port logic of the core partition circuit according to the first control signal.

9 Claims, 3 Drawing Sheets

(51) Int. Cl.
*H03K 19/20* (2006.01)
*G01R 31/3185* (2006.01)
*G01R 31/3183* (2006.01)
*G01R 31/28* (2006.01)

(52) U.S. Cl.
CPC . *G01R 31/31724* (2013.01); *G01R 31/31727* (2013.01); *G01R 31/318335* (2013.01); *G01R 31/318508* (2013.01); *G01R 31/318583* (2013.01); *H03K 19/20* (2013.01)

(56) References Cited

U.S. PATENT DOCUMENTS

| | | | |
|---|---|---|---|
| 8,539,293 B2* | 9/2013 | Lee | G01R 31/318547 714/30 |
| 8,627,159 B2 | 1/2014 | Policke et al. | |
| 8,856,601 B2* | 10/2014 | Ravi | G01R 31/318547 714/726 |
| 9,395,414 B2 | 7/2016 | Sonawane et al. | |
| 10,338,139 B1* | 7/2019 | Ge | G01R 31/318541 |
| 10,401,427 B2 | 9/2019 | Lundberg | |
| 10,775,432 B2* | 9/2020 | Londhe | G01R 31/318335 |
| 10,908,213 B1 | 2/2021 | Gizdarski | G01R 31/318583 |
| 2007/0283200 A1* | 12/2007 | Casarsa | G01R 31/318547 714/724 |
| 2008/0288838 A1* | 11/2008 | Anzou | G11C 29/32 714/726 |
| 2009/0106613 A1* | 4/2009 | Goyal | G01R 31/318547 714/E11.155 |
| 2011/0289369 A1* | 11/2011 | Lee | G01R 31/318547 714/E11.155 |
| 2011/0307750 A1* | 12/2011 | Narayanan | G01R 31/3177 714/E11.055 |
| 2012/0030532 A1* | 2/2012 | Jain | G01R 31/318547 714/E11.067 |
| 2012/0124433 A1* | 5/2012 | Policke | G01R 31/318558 714/724 |
| 2012/0126781 A1* | 5/2012 | Narayanan | G01R 19/257 324/76.11 |
| 2012/0233514 A1* | 9/2012 | Patil | G01R 31/318561 714/E11.02 |
| 2012/0246529 A1* | 9/2012 | Tekumalla | G01R 31/318541 714/E11.155 |
| 2013/0055041 A1* | 2/2013 | Tekumalla | G01R 31/318544 714/E11.155 |
| 2013/0159800 A1* | 6/2013 | Ravi | G01R 31/3177 714/727 |
| 2014/0298123 A1* | 10/2014 | Tekumalla | G06F 11/2017 714/726 |
| 2015/0323596 A1* | 11/2015 | Potty | G01R 31/318544 714/727 |
| 2016/0169971 A1 | 6/2016 | Oomman et al. | |
| 2016/0266202 A1* | 9/2016 | Mittal | G01R 31/31725 |
| 2019/0033374 A1* | 1/2019 | Bhagwat | G06F 12/1425 |
| 2022/0099735 A1* | 3/2022 | Xing | G01R 31/318508 |

FOREIGN PATENT DOCUMENTS

| | | |
|---|---|---|
| CN | 105988080 A | 10/2016 |
| CN | 107300666 A | 10/2017 |
| CN | 107612540 A | 1/2018 |
| CN | 108347660 A | 7/2018 |
| CN | 108957301 A | 12/2018 |
| CN | 110514981 A | 11/2019 |
| CN | 111103531 A | 5/2020 |
| TW | 557637 B | 10/2003 |

OTHER PUBLICATIONS

Wohl et al., Fully X-tolerant Combinational Scan Compression, 2007, IEEE, pp. 1-10. (Year: 2007).*

Chinese language office action dated May 26, 2022, issued in application No. 202011046827.8.

Li S., et al.; "Optimization method of scan test compression circuit based on EDT;" Journal of Beijing University of Aeronautics and Astronautics, 2020; 46(8); Jan. 2020; pp. 1601-1609.

English language abstract of "Optimization method of scan test compression circuit based on EDT".

Che Bin., et al.; "Research of Design-on-Testability for SoC;" Measurement & Control Technology; 2009; issue 6; Jun. 2009; pp. 1-4.

English language abstract of "Research of Design-on-Testability for SoC".

Chinese language Notice of Allowance dated Oct. 12, 2022, issued in application No. CN 202011046827.8.

* cited by examiner

CORE PARTITION CIRCUIT AND TESTING DEVICE

CROSS REFERENCE TO RELATED APPLICATIONS

This application claims priority of China Patent Application No. 202011046827.8, filed on Sep. 29, 2020, the entirety of which is incorporated by reference herein.

BACKGROUND OF THE INVENTION

Field of the Invention

The present invention relates to a system on chip, specially relates to a core partition circuit and a testing device.

Description of the Related Art

In conventional design for testability device, hereinafter referred to as a testing device, wrapper chains of each core partition circuit of the testing device need to be connected to a compression circuit in the upper level partition circuit while in an external test mode (also known as an extest mode), herein the design for testability device is commonly referred to as DFT for short. In these conventional designs of the testing device, the design of the upper level partition circuit may be related to the structure of the wrapper chains of the next level partition circuit. Once the structure of the wrapper chains of the core partition circuit changes, the design of the structure of the compression circuit of the upper level partition circuit is affected.

Since the design of the upper level partition circuit always needs to take the structure of the wrapper chains of the next level core partition circuit into consideration, the structure of the compression circuit of the upper level partition circuit needs to change accordingly after the structure of each core scanning chain changes. This may increase both the complexity and inconvenience of circuit design. Therefore, how to improve the design of the testing device is still a topic worthy of study.

BRIEF SUMMARY OF THE INVENTION

The present invention provides a core partition circuit and a testing device, thereby reducing the complexity of the circuit design and increasing the convenience of use.

The present invention provides a core partition circuit, which includes a first decompression circuit, a second decompression circuit, a first switching circuit, an wrapper scanning circuit, a first compression circuit, a second compression circuit and a second switching circuit. The first decompression circuit is configured to receive and decompress an input signal. The second decompression circuit is configured to receive and decompress the input signal. The first switching circuit is configured to output the output signal of the first decompression circuit or the second decompression circuit according to a first control signal. The wrapper scanning circuit is coupled to the first switching circuit, and configured to receive the output signal of the first decompression circuit or the second decompression circuit to scan the internal or the port of the core partition circuit and generate a first internal logic or a port logic. The first compression circuit is coupled to the wrapper scanning circuit and configured to receive the first internal logic. The first compression circuit generates and compresses an internal logic of the core partition circuit according to the first internal logic. The second compression circuit is coupled to the wrapper scanning circuit and configured to receive and compress the port logic of the core partition circuit. The second switching circuit is coupled to the first compression circuit and the second compression circuit, and configured to output a compressed internal logic of the core partition circuit or a compressed port logic of the core partition circuit according to the first control signal.

In addition, the present invention provides a testing device, which includes a compression logic circuit and a first core partition circuit. The first core partition circuit includes a first decompression circuit, a second decompression circuit, a first switching circuit, an wrapper scanning circuit, a first compression circuit, a second compression circuit and a second switching circuit. The first decompression circuit is configured to receive and decompress an input signal. The second decompression circuit is configured to receive and decompress the input signal. The first switching circuit is configured to output the output signal of the first decompression circuit or the second decompression circuit according to a first control signal. The wrapper scanning circuit is coupled to the first switching circuit and is configured to receive the output signal of the first decompression circuit or the second decompression circuit to scan an internal or a port logic of the first core partition circuit and generate a first internal logic or a port logic. The first compression circuit is coupled to the wrapper scanning circuit and is configured to receive the first internal logic. The first compression circuit generates and compresses an internal logic of the core partition circuit according to the first internal logic. The second compression circuit is coupled to the wrapper scanning circuit and is configured to receive and compress the port logic of the first core partition circuit. The second switching circuit is coupled to the first compression circuit and the second compression circuit. The second switching circuit is configured to output a compressed internal logic of the first core partition circuit or a compressed port logic of the first partition circuit according to the first control signal. When the testing device operates in an internal test mode, the first core partition circuit operates independently. When the testing device operates in an external test mode, the first core partition circuit and the compression logic circuit operate simultaneously.

According to the core partition circuit and testing device disclosed by the present invention, the wrapper scanning circuit is configured between the first decompression circuit and the first compression circuit and is configured between the second decompression circuit and the second compression circuit. In an internal test mode, the first switching circuit outputs the output signal of the first decompression circuit to the wrapper scanning circuit, and the second switching circuit outputs the output signal of the first compression circuit. In an external test mode, the first switching circuit outputs the output signal of the second decompression circuit to the wrapper scanning circuit, and the second switching circuit outputs the output signal of the second compression circuit. Since the wrapper scanning circuit of the core partition circuit does not need to be connected to the compression logic circuit of the upper level circuit in the external test mode, when the structure of the wrapper scanning circuit changes, the structure of the compression logic circuit of the upper level circuit does not need to change accordingly. Therefore, the complexity of the circuit design may be effectively reduced and the convenience of use is increased.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In each of the following embodiments, the same reference number represents an element or component that is the same or similar.

Figure 1:
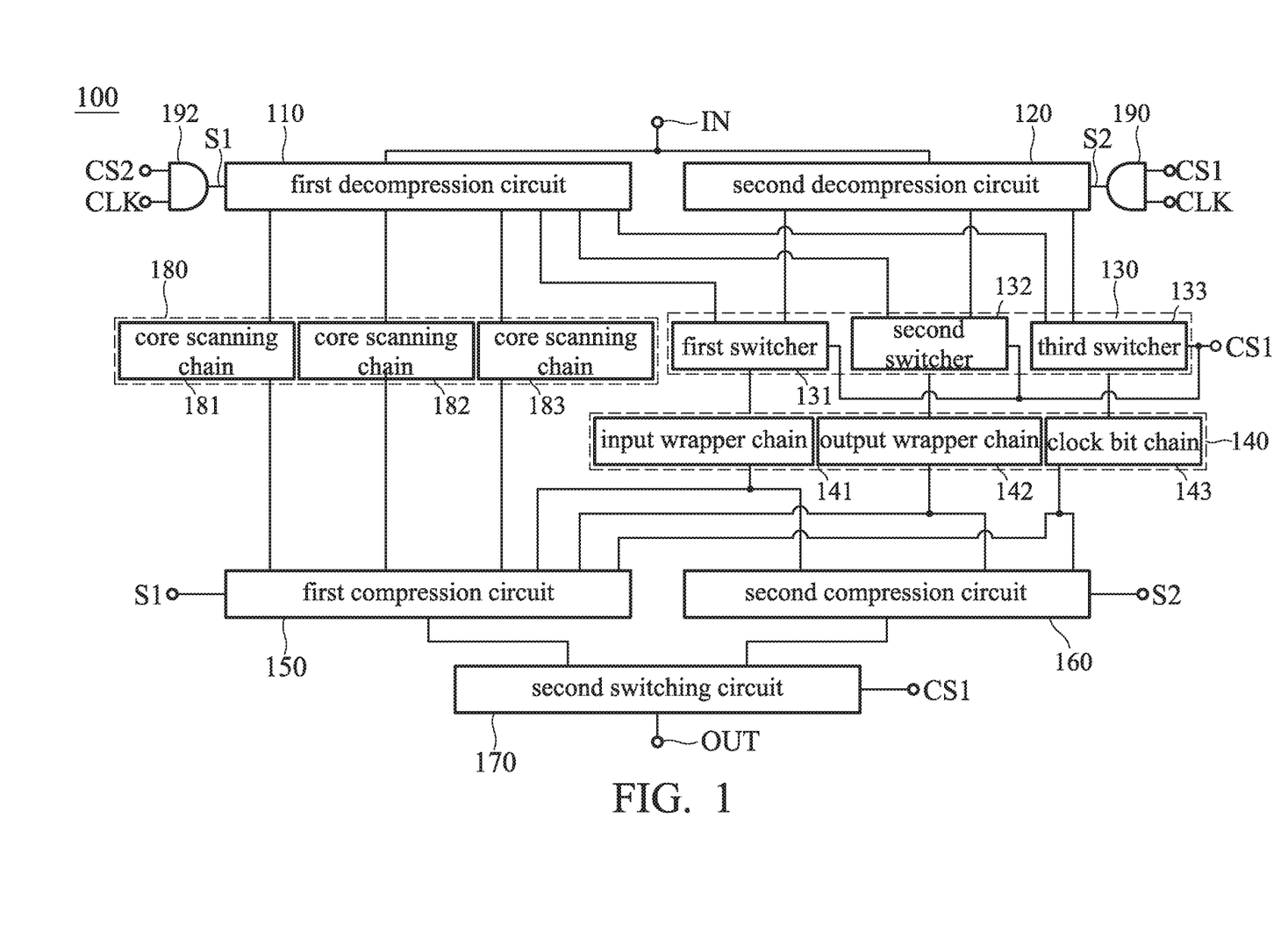
FIG. 1 shows a schematic view of a core partition circuit 100 according to an embodiment of the present invention.

FIG. 1 shows a schematic view of a core partition circuit 100 according to an embodiment of the present invention. In the embodiment, the core partition circuit 100 may be applied to a testing device. Please refer to FIG. 1. The core partition circuit 100 includes an input terminal IN, a first decompression circuit 110, a second decompression circuit 120, a first switching circuit 130, a wrapper scanning circuit 140, a first compression circuit 150, a second compression circuit 160, a second switching circuit 170, a core scanning chain circuit 180 and an output terminal OUT.

The input terminal IN receives a data input signal. The first decompression circuit 110 is coupled to the input terminal IN to receive the data input signal. The first decompression circuit 110 further receives a first signal S1 and decompresses the data input signal according to the first signal S1. That is, the first decompression circuit 110 is controlled by the first signal S1. According to an embodiment of the present invention, a clock signal CLK may be directly configured as the first signal S1, in the meanwhile, a low logic level signal is configured as a second signal S2, but the embodiment of the present invention is not limited thereto.

The second decompression circuit 120 is coupled to the input terminal IN to receive the data input signal. The second decompression circuit 120 further receives the second signal S2 and decompresses the data input signal according to the second signal S2. That is, the second decompression circuit 120 is controlled by the second signal S2. According to an embodiment of the present invention, the clock signal CLK may be directly configured as the second signal S2, in the meanwhile, the low logic level signal is configured as the first signal S1, but the embodiment of the present invention is not limited thereto.

The first switching circuit 130 is coupled to the first decompression circuit 110 and the second decompression circuit 120 to receive the output signal of the first decompression circuit 110 or the output signal of the second decompression circuit 120. The first switching circuit 130 receives a first control signal CS1, and the first switching circuit 130 determines to output the output signal of the first decompression circuit 110 or the output signal of the second decompression circuit 120 according to the first control signal CS1. In the embodiment, the first control signal CS1 indicates the operation mode of the core partition circuit 100.

For example, when the first control signal CS1 is at a low logic level, indicates that the core partition circuit 100 operates in an internal test mode, and the first switching circuit 130 outputs the output signal of the first decompression circuit 110. When the first control signal CS1 is at a high logic level, indicates that the core partition circuit 100 operates in an external test mode, and the first switching circuit 130 outputs the output signal of the second decompression circuit 120.

The wrapper scanning circuit 140 is coupled to the first switching circuit 130 to receive the output signal of the first switching circuit 130, herein the output signal of the first switching circuit 130 is the output signal of the first decompression circuit 110 or the output signal of the second decompression circuit 120. When the core partition circuit 100 operates in the internal test mode, the wrapper scanning circuit 140 receives the output signal of the first decompression circuit 110 outputted by the first switching circuit 130 to scan a part of internal circuit of the core partition circuit 100. When the core partition circuit 100 operates in the external test mode, the wrapper scanning circuit 140 receives the output signal of the second decompression circuit 120 outputted by the first switching circuit 130 to scan the port circuit of the core partition circuit 100.

The first compression circuit 150 is coupled to the wrapper scanning circuit 140 to receive the data signal outputted by the wrapper scanning circuit 140. The first compression circuit 150 further receives the first signal S1, and compresses the data signal outputted by the wrapper scanning circuit 140 according to the first signal S1, so as to generate and output a first internal compression signal. According to an embodiment of the present invention, the first decompression circuit 110 and the first compression circuit 150 are both controlled by the first signal S1, the first decompression circuit 110 and the first compression circuit 150 may operate simultaneously. So that, the data signal outputted by the wrapper scanning circuit 140 is a partial internal logic, herein the partial internal logic is generated by the wrapper scanning circuit 140 according to the output signal of the first decompression circuit 110 outputted by the first switching circuit 130, through scanning the part of the internal circuit of the core partition circuit 100. The first internal compression signal is the compressed partial internal logic. Herein, the internal logic is generated by scanning the internal circuit and indicates whether the performance of the internal circuit conforms expectations.

The second compression circuit 160 is coupled to the wrapper scanning circuit 140 to receive the data signal outputted by the wrapper scanning circuit 140. The second compression circuit 160 further receives the second signal S2, and compresses the data signal outputted by the wrapper scanning circuit 140 according to the first signal S2, so as to generate and output a port compression signal. According to an embodiment of the present invention, the second decompression circuit 120 and the second compression circuit 160 are both controlled by the second signal S2, the second decompression circuit 120 and the second compression circuit 160 may operate simultaneously. So that, the data signal outputted by the wrapper scanning circuit 140 is a port logic, herein the port logic is generated by the wrapper scanning circuit 140 according to the output signal of the second decompression circuit 120 outputted by the first switching circuit 130, through scanning the port circuit of the core partition circuit 100. The port compression signal is the compressed port logic. Herein, the port logic is generated by scanning the port circuit and indicates whether the performance of the port circuit conforms expectations.

The second switching circuit 170 is coupled to the first compression circuit 150 and the second compression circuit 160 to receive the first internal compression signal or the port compression signal. The second switching circuit 170 further receives the first control signal CS1, and selects to output the first internal compression signal or the port compression signal according to the first control signal CS1. For example, when the first control signal CS1 is at the low logic level, the second switching circuit 170 outputs the first internal compression signal generated by the first compression circuit 150. When the first control signal CS1 is at the high logic level, the second switching circuit 170 outputs the port compression signal generated by the second compression circuit 160.

The core scanning chain circuit 180 is coupled between the first decompression circuit 110 and the first compression circuit 150. In addition, the core scanning chain circuit 180 may include at least one core scanning chain, such as the core scanning chains 181, 182 and 183 as shown in FIG. 1, to scan the remaining part of the internal circuit of the core partition circuit 100 according to the output signal generated by the first decompression circuit 110, and output a scanning result to the first compression circuit 150. The first compression circuit 150 generates a second internal compression signal according to the scanning result. According to an embodiment of the present invention, the wrapper scanning circuit 140 scans out the partial internal logic of the core partition circuit 100, the core scanning chain circuit 180 scans out the remaining internal logic of the core partition circuit 100, the first compression circuit 150 receives and compresses the partial internal logic and the remaining internal logic to generate an internal compression signal. That is, the internal compression signal includes the first internal compression signal and the second internal compression signal.

The second switching circuit 170 is coupled to the output terminal OUT. The second switching circuit 170 outputs the internal compression signal or the port compression signal according to the first control signal CS1 through the output terminal OUT.

In terms of the overall operation of the core partition circuit 100, when the first control signal CS1 is at the low logic level, indicates that the core partition circuit 100 operates in the internal test mode. Then, the first decompression circuit 110, the core scanning chain circuit 180, the first switching circuit 130, the wrapper scanning circuit 140, the first compression circuit 150 and the second switching circuit 170 operate to scan the internal circuit of the core partition circuit 100.

When the first control signal CS1 is at the high logic level, indicates that the core partition circuit 100 operates in the external test mode. Then, the second decompression circuit 120, the first switching circuit 130, the wrapper scanning circuit 140, the second compression circuit 160 and the second switching circuit 170 operate to scan the port circuit of the core partition circuit 100.

Since the wrapper scanning circuit 140 of the core partition circuit 100 does not need to be connected to the compression logic circuit of the upper level circuit in the external test mode, i.e., the wrapper scanning circuit 140 and the compression logic circuit of the upper level circuit are configured independently, when the structure of the port circuit of the core partition circuit 100 changes and causes a change of the wrapper scanning circuit 140, the change is irrelevant to the compression logic circuit of the upper level circuit, and the structure of the compression logic circuit of the upper level circuit does not need to change accordingly. Therefore, the complexity of the circuit design may be effectively reduced and the convenience of use is increased.

In the embodiment, the wrapper scanning circuit 140 includes an input wrapper chain 141, an output wrapper chain 142 and a clock bit chain 143.

The input wrapper chain 141 is coupled to the first switching circuit 130, the first compression circuit 150 and the second compression circuit 160. In the embodiment, the input wrapper chain 141 may be a wrapper input chain, which is used to isolate the data signal related to the input interface from the outside in the internal test mode.

The output wrapper chain 142 is coupled to the first switching circuit 130, the first compression circuit 150 and the second compression circuit 160. In the embodiment, the output wrapper chain 142 may be a wrapper output chain, which is used to isolate the data signal related to the output interface from the outside in the external test mode.

The clock bit chain 143 is coupled to the first switching circuit 130, the first compression circuit 150 and the second compression circuit 160, which is used to control all clock signals (such as the clock signal CLK) used by the core partition circuit 100 in the internal test mode and the external test mode.

In addition, the first switching circuit 130 may include a first switcher 131, a second switcher 132 and a third switcher 133. The first switcher 131 is coupled to the input wrapper chain 141, the first decompression circuit 110 and the second decompression circuit 120. The first switcher 131 selects to output the output signal of the first decompression circuit 110 or the output signal of the second decompression circuit 120 to the input wrapper chain 141 according to the first control signal CS1. For example, when the first control signal CS1 is at the low logic level, the first switcher 131 selects to output the output signal of the first decompression circuit 110 to the input wrapper chain 141. When the first control signal CS1 is at the high logic level, the first switcher 131 selects to output the output signal of the second decompression circuit 120 to the input wrapper chain 141.

The second switcher 132 is coupled to the output wrapper chain 142, the first decompression circuit 110 and the second decompression circuit 120. The second switcher 132 selects to output the output signal of the first decompression circuit 110 or the output signal of the second decompression circuit 120 to the output wrapper chain 142 according to the first control signal CS1. For example, when the first control signal CS1 is at the low logic level, the second switcher 132 selects to output the output signal of the first decompression circuit 110 to the output wrapper chain 142. When the first control signal CS1 is at the high logic level, the second switcher 132 selects to output the output signal of the second decompression circuit 120 to the output wrapper chain 142.

The third switcher 133 is coupled to the clock bit chain 143, the first decompression circuit 110 and the second decompression circuit 120. The third switcher 133 selects to output the output signal of the first decompression circuit 110 or the output signal of the second decompression circuit 120 to the clock bit chain 143 according to the first control signal CS1. For example, when the first control signal CS1 is at the low logic level, the third switcher 133 selects to output the output signal of the first decompression circuit 110 to the clock bit chain 143. When the first control signal CS1 is at the high logic level, the third switcher 133 selects to output the output signal of the second decompression circuit 120 to the clock bit chain 143.

In addition, in the embodiment, one of the first signal S1 and the second signal S2 is the same as the clock signal CLK, the other of the first signal S1 and the second signal S2 is at the low logic level. That is, when the first signal S1 is the same as the clock signal CLK, the second signal S2 is at the low logic level, the first decompression circuit 110 and the first compression circuit 150 are driven, the second decompression circuit 120 and the second compression circuit 160 are disabled, such that the core partition circuit 100 operates in the internal test mode. When the second signal S2 is the same as the clock signal CLK, the first signal S1 is at the low logic level, the second decompression circuit 120 and the second compression circuit 160 are driven, the first decompression circuit 110 and the first compression circuit 150 are disabled, such that the core partition circuit 100 operates in the external test mode. Therefore, the power consumption of the core partition circuit 100 may be effectively reduced.

According to another embodiment of the present invention, the core partition circuit 100 may further include a first AND gate 190 and the second AND gate 192. The first AND gate 190 includes a first input terminal, a second input terminal and an output terminal. The first input terminal of the first AND gate 190 receives the first control signal CS1. The second input terminal of the first AND gate 190 receives the clock signal CLK. The output terminal of the first AND gate 190 is coupled to the second decompression circuit 120 to output the second signal S2. For example, when the first control signal CS1 is at the high logic level, the second signal S2 is the same as the clock signal CLK. When the first control signal CS1 is at the low logic level, the second signal S2 is at the low logic level.

The second AND gate 192 includes a first input terminal, a second input terminal and an output terminal. The first input terminal of the second AND gate 192 receives the second control signal CS2. The second input terminal of the second AND gate 192 receives the clock signal CLK. The output terminal of the second AND gate 192 is coupled to the first decompression circuit 110 to output the first signal S1. For example, when the second control signal CS2 is at the high logic level, the first signal S1 is the same as the clock signal CLK. When the second control signal CS2 is at the low logic level, the first signal S1 is at the low logic level. Herein, the first control signal CS1 is the inversion signal of the second control signal CS2, so that, one of the first signal S1 and the second signal S2 is the same as the clock signal CLK, the other of the first signal S1 and the second signal S2 is at the low logic level.

For example, when the first control signal CS1 is at the high logic level, the second control signal CS2 is at the low logic level, indicates that the core partition circuit 100 operates in the external test mode. When the second control signal CS2 is at the high logic level, the first control signal CS1 is at the low logic level, indicates that the core partition circuit 100 operates in the external test mode. Therefore, when the core partition circuit 100 needs to be operated in the internal test mode, the second control signal CS2 is configured to be at the high logic level to make the first signal S1 the same as the clock signal CLK, thus, the first decompression circuit 110 and the first compression circuit 150 are driven. At the same time, the first control signal CS1 is at the low logic level and makes the second signal S2 at the low logic level, thus, the second decompression circuit 120 and the second compression circuit 160 are disabled. When the core partition circuit 100 needs to be operated in the external test mode, the second control signal CS2 is configured to be at the low logic level to make the first signal S1 at the low logic level, thus, the first decompression circuit 110 and the first compression circuit 150 are disabled. Accordingly, the power consumption of the core partition circuit 100 may be effectively reduced. At the same time, the first control signal CS1 is at the high logic level and makes the second signal S2 the same as the clock signal CLK, thus, the second decompression circuit 120 and the second compression circuit 160 are driven.

Figure 2A:
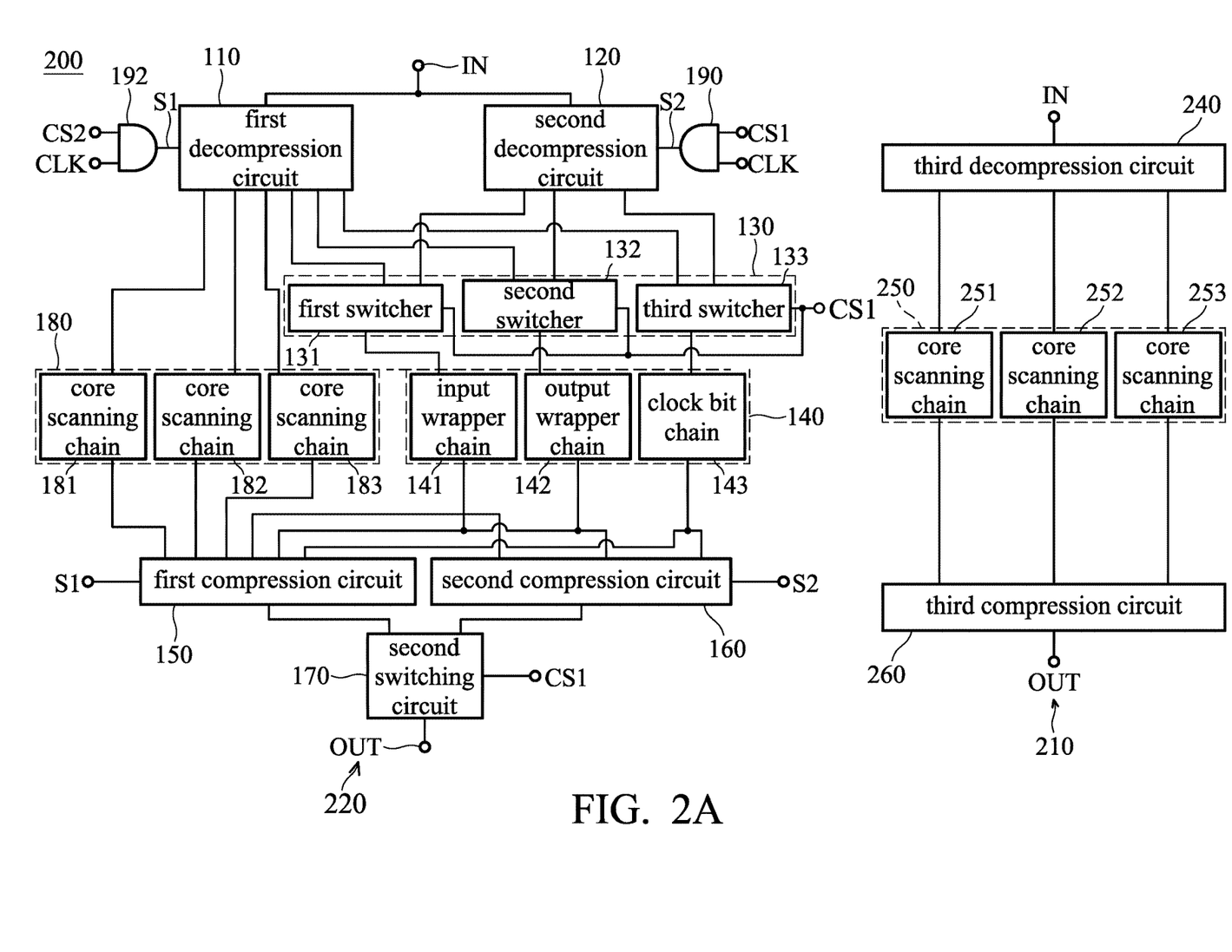
FIGS. 2A and 2B show a schematic view of a testing device 200 according to an embodiment of the present invention.
Figure 2B:
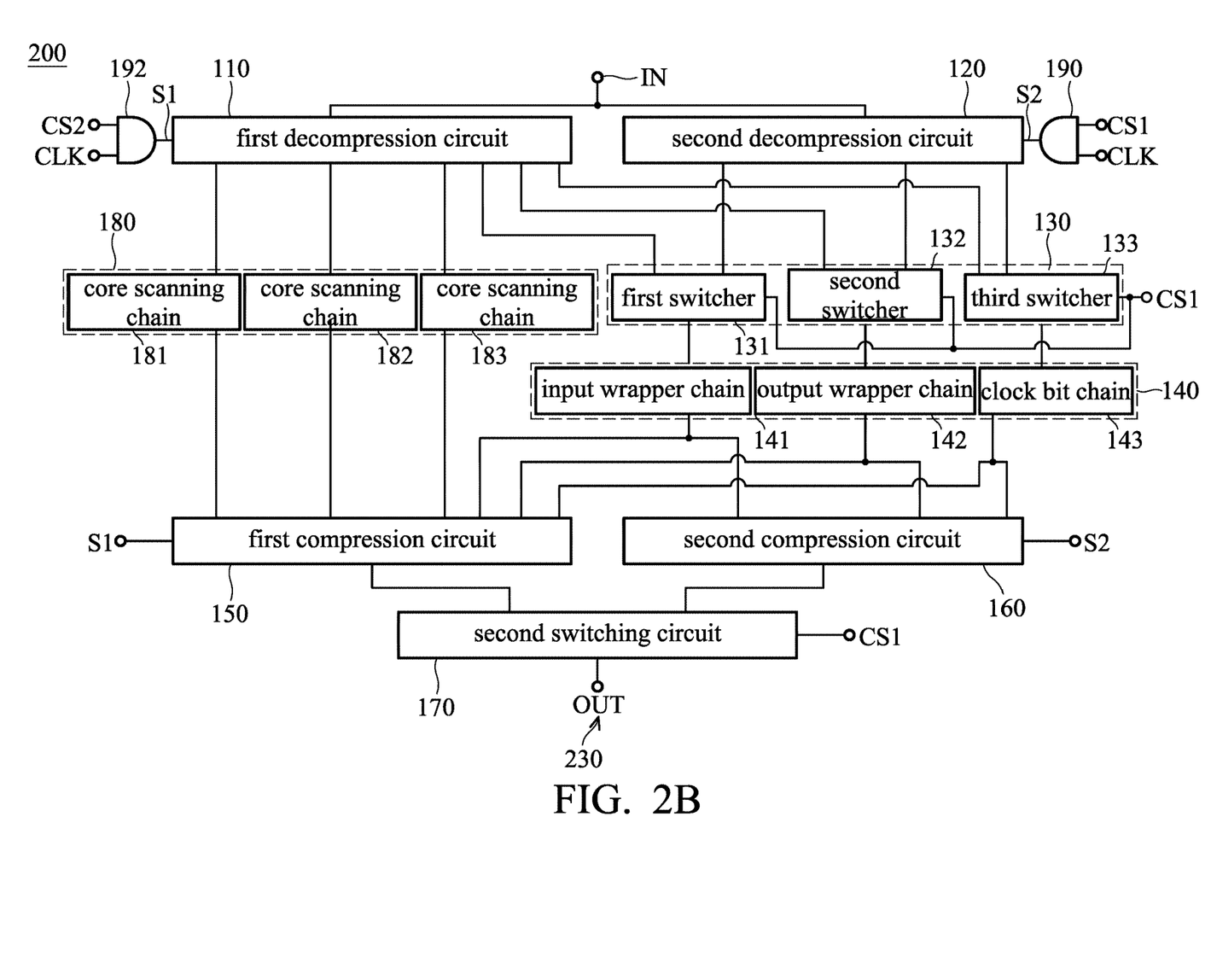

FIGS. 2A and 2B show a schematic view of a testing device 200 according to an embodiment of the present invention. Please refer to FIGS. 2A and 2B. The testing device 200 includes compression logic circuit 210 and a plurality of core partition circuits 220 and 230. In the embodiment, the core partition circuits 220 and 230 and the internal circuit components thereof are identical to or similar to the core partition circuit 100 and the internal circuit components thereof in FIG. 1. Accordingly, the core partition circuits 220 and 230 in FIGS. 2A and 2B may refer to the description of the embodiment of FIG. 1, and the description thereof is not repeated herein.

In the embodiment, the compression logic circuit 210 is configured, for example, in the upper level circuit of the core partition circuits 220 and 230. The compression logic circuit 210 may include a third decompression circuit 240, a core scanning chain circuit 250 and the third compression circuit 260. The third decompression circuit 240 is coupled to the input terminal IN to receive the data input signal. The core scanning chain circuit 250 is coupled to the third decompression circuit 240. In addition, the core scanning chain circuit 250 may include core scanning chains 251, 252 and 253. The third compression circuit 260 is coupled to the core scanning chain circuit 250 and the output terminal OUT.

When the testing device 200 operates in the internal test mode, the core partition circuit 220 and the core partition circuit 230 may operate separately or operate simultaneously. That is, in one embodiment, when the testing device 200 operates in the internal test mode, only the first decompression circuit 110, the core scanning chain circuit 180, the first switching circuit 130, the wrapper scanning circuit 140, the first compression circuit 150 and the second switching circuit 170 of the core partition circuit 220 operate to scan the internal circuit of the core partition circuit 220. In one embodiment, when the testing device 200 operates in the internal test mode, only the first decompression circuit 110, the core scanning chain circuit 180, the first switching circuit 130, the wrapper scanning circuit 140, the first compression circuit 150 and the second switching circuit 170 of the core partition circuit 230 operate to scan the internal circuit of the core partition circuit 230. In one embodiment, when the testing device 200 operates in the internal test mode, the first decompression circuits 110, the core scanning chain circuits 180, the first switching circuits 130, the wrapper scanning circuits 140, the first compression circuits 150 and the second switching circuits 170 of the core partition circuit 220 and the core partition circuit 230 operate simultaneously to scan the internal circuit of the core partition circuit 220 and the internal circuit of the core partition circuit 230.

When the testing device 200 operates in the external test mode, the core partition circuit 220, the core partition circuit 230 and the compression logic circuit 210 operate simultaneously. Specifically, when the testing device 200 operates in the external test mode, the second decompression circuits 120, the first switching circuits 130, the wrapper scanning circuits 140, the second compression circuits 160 and the second switching circuits 170 of the core partition circuit 220 and the core partition circuit 230. and the third decompression circuit 240, the core scanning chain circuit 250 and the third compression circuit 260 of the compression logic circuit 210 operate simultaneously to scan the port logic of the core partition circuit 220, the port logic of the core partition circuit 230 and the port circuit of the compression logic circuit 210.

Since the wrapper scanning circuits 140 of the core partition circuit 220 and the core partition circuit 230 do not need to be connected to the compression logic circuit 210 of the upper level circuit in the external test mode, i.e., the compression logic circuit 210 of the upper level circuit and the wrapper scanning circuits 140 are configured independently. Therefore, when the structures of the wrapper scanning circuits 140 changes, the structure of the compression logic circuit 210 of the upper level circuit does not need to change accordingly. Thus, the complexity of the circuit design may be effectively reduced and the convenience of use is increased.

In summary, according to the core partition circuit and the testing device disclosed by the present invention, the wrapper scanning circuit is configured between the first decompression circuit and the first compression circuit and between the second decompression circuit and the second compression circuit. In the internal test mode, the first switching circuit outputs the output signal of the first decompression circuit to the wrapper scanning circuit, and the second switching circuit takes the output signal of the first compression circuit as the output signal. Alternatively, in the external test mode, the first switching circuit outputs the output signal of the second decompression circuit to the wrapper scanning circuit, and the second switching circuit takes the output signal of the second compression circuit as the output signal. Since the wrapper scanning circuit of the core partition circuit does not need to be connected to the compression logic circuit of the upper level circuit in the external test mode, i.e., the compression logic circuit of the upper level circuit and the wrapper scanning circuit are configured independently, when the structure of the wrapper scanning circuit changes, the structure of the compression logic circuit of the upper level circuit does not need to change accordingly. Therefore, the complexity of the circuit design may be effectively reduced and the convenience of use is increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A core partition circuit, receiving an input signal, wherein the core partition circuit comprises:
    a first decompression circuit, configured to receive and decompress the input signal;
    a second decompression circuit, configured to receive and decompress the input signal;
    a first switching circuit, coupled to the first decompression circuit and the second decompression circuit, and configured to output an output signal of the first decompression circuit or an output signal of the second decompression circuit according to a first control signal;
    a wrapper scanning circuit, coupled to the first switching circuit, and configured to receive the output signal of the first decompression circuit or the output signal of the second decompression circuit to scan an internal circuit of the core partition circuit or a port circuit of the core partition circuit and output a first internal logic or a port logic of the core partition circuit;
    a first compression circuit, coupled to the wrapper scanning circuit and configured to receive the first internal logic of the core partition circuit and compress an internal logic of the core partition circuit according to the first internal logic;
    a second compression circuit, coupled to the wrapper scanning circuit and configured to receive and compress the port logic of the core partition circuit; and
    a second switching circuit, coupled to the first compression circuit and the second compression circuit, and configured to output a compressed internal logic of the core partition circuit or a compressed port logic of the core partition circuit according to the first control signal;
    wherein the first control signal is an inversion signal of a second control signal;
    wherein the wrapper scanning circuit comprises:
    an input wrapper chain, coupled to the first switching circuit, the first compression circuit and the second compression circuit;
    an output wrapper chain, coupled to the first switching circuit, the first compression circuit and the second compression circuit; and
    a clock bit chain, coupled to the first switching circuit, the first compression circuit and the second compression circuit.

2. The core partition circuit as claimed in claim 1, wherein the first switching circuit comprises:
    a first switcher, coupled to the input wrapper chain, the first decompression circuit and the second decompression circuit, and configured to output the output signal of the first decompression circuit or the output signal of the second decompression circuit according to the first control signal;
    a second switcher, coupled to the output wrapper chain, the first decompression circuit and the second compression circuit, and configured to output the output signal of the first compression circuit or the output signal of the second compression circuit according to the first control signal; and
    a third switcher, coupled to the clock bit chain, the first decompression circuit and the second decompression circuit, and configured to output the output signal of the first compression circuit or the output signal of the second compression circuit according to the first control signal.

3. The core partition circuit as claimed in claim 1, further comprising:
    a first AND gate, comprising a first input terminal, a second input terminal and an output terminal, wherein the first input terminal of the first AND gate receives the first control signal, the second input terminal of the first AND gate receives a clock signal, and the output terminal of the first AND gate is coupled to the second decompression circuit and generates a second signal; and
    a second AND gate, comprising a first input terminal, a second input terminal and an output terminal, wherein the first input terminal of the second AND gate receives the second control signal, the second input terminal of the second AND gate receives the clock signal, and the output terminal of the second AND gate is coupled to the first decompression circuit and generates a first signal;
    wherein the first decompression circuit receives and decompresses the input signal according to the first signal, and the second decompression circuit receives and decompresses the input signal according to the second signal.

4. The core partition circuit as claimed in claim 1, further comprising:
a core scanning chain circuit, coupled between the first decompression circuit and the first compression circuit, and configured to scan the internal circuit of the core partition circuit and output a second internal logic of the core partition circuit, wherein the first compression circuit compresses the first internal logic and the second internal logic to generate the compressed internal logic.

5. A testing device, receiving an input signal, wherein the testing device comprises:
a compression logic circuit; and
a first core partition circuit, comprising:
a first decompression circuit, configured to receive and decompress the input signal;
a second decompression circuit, configured to receive and decompress the input signal;
a first switching circuit, coupled to the first decompression circuit and the second decompression circuit, and configured to output an output signal of the first decompression circuit or an output signal of the second decompression circuit according to a first control signal;
a wrapper scanning circuit, coupled to the first switching circuit, and configured to receive the output signal of the first decompression circuit or the output signal of the second decompression circuit to scan an internal circuit of the first core partition circuit or a port circuit of the first core partition circuit and output a first internal logic or a port logic of the first core partition circuit;
a first compression circuit, coupled to the wrapper scanning circuit and configured to receive the first internal logic of the first core partition circuit and compress an internal logic of the first core partition circuit according to the first internal logic;
a second compression circuit, coupled to the wrapper scanning circuit and configured to receive and compress the port logic of the first core partition circuit; and
a second switching circuit, coupled to the first compression circuit and the second compression circuit, and configured to output a compressed internal logic of the first core partition circuit or a compressed port logic of the first core partition circuit according to the first control signal;
wherein when the testing device operates in an internal test mode, the first core partition circuit operates independently;
wherein when the testing device operates in an external test mode, the first core partition circuit and the compression logic circuit operate simultaneously;
wherein the first control signal is an inversion signal of a second control signal;
wherein the wrapper scanning circuit comprises:
an input wrapper chain, coupled to the first switching circuit, the first compression circuit and the second compression circuit;
an output wrapper chain, coupled to the first switching circuit, the first compression circuit and the second compression circuit; and
a clock bit chain, coupled to the first switching circuit, the first compression circuit and the second compression circuit.

6. The testing device as claimed in claim 5, wherein the first switching circuit comprises:
a first switcher, coupled to the input wrapper chain, the first decompression circuit and the second decompression circuit, and configured to output the output signal of the first decompression circuit or the output signal of the second decompression circuit according to the first control signal;
a second switcher, coupled to the output wrapper chain, the first decompression circuit and the second decompression circuit, and configured to output the output signal of the first decompression circuit or the output signal of the second decompression circuit according to the first control signal; and
a third switcher, coupled to the clock bit chain, the first decompression circuit and the second decompression circuit, and configured to output the output signal of the first decompression circuit or the output signal of the second decompression circuit according to the first control signal.

7. The testing device as claimed in claim 5, wherein the first core partition circuit further comprises:
a first AND gate, comprising a first input terminal, a second input terminal and an output terminal, wherein the first input terminal of the first AND gate receives the first control signal, the second input terminal of the first AND gate receives a clock signal, and the output terminal of the first AND gate is coupled to the second decompression circuit and generates a second signal; and
a second AND gate, comprising a first input terminal, a second input terminal and an output terminal, wherein the first input terminal of the second AND gate receives the second control signal, the second input terminal of the second AND gate receives the clock signal, and the output terminal of the second AND gate is coupled to the first decompression circuit and generates a first signal;
wherein the first decompression circuit receives and decompresses the input signal according to the first signal, and the second decompression circuit receives and decompresses the input signal according to the second signal.

8. The testing device as claimed in claim 5, wherein the first core partition circuit further comprises:
a core scanning chain circuit, coupled between the first decompression circuit and the first compression circuit, and configured to scan the internal circuit of the first core partition circuit and output a second internal logic of the first core partition circuit, wherein the first compression circuit compresses the first internal logic and the second internal logic to generate the compressed internal logic.

9. The testing device as claimed in claim 5, wherein the compression logic circuit comprises:
a third decompression circuit;
a core scanning chain circuit, coupled to the third decompression circuit; and
a third compression circuit, coupled to the core scanning chain circuit.

* * * * *